United States Patent [19]
Kent et al.

[11] Patent Number: 5,603,985
[45] Date of Patent: Feb. 18, 1997

[54] BLOCK COPOLYMER ADHESION PROMOTERS VIA RING-OPENING METATHESIS POLYMERIZATION

[76] Inventors: Michael S. Kent, 12320 Pine Ridge, NE, Albuquerque, N.M. 87112; Randall Saunders, 13201 Fruit Ave., NE, Albuquerque, N.M. 87123

[21] Appl. No.: 564,753

[22] Filed: Nov. 29, 1995

[51] Int. Cl.$^6$ .................................................. B05D 5/10
[52] U.S. Cl. .................. 427/207.1; 427/333; 427/388.1; 427/393.5
[58] Field of Search ................. 427/207.1, 208, 427/208.2, 208.4, 208.6, 208.8, 333, 386, 388.1, 393.5, 393.6

[56] References Cited

U.S. PATENT DOCUMENTS

| | | | |
|---|---|---|---|
| 3,837,964 | 9/1974 | Cotton et al. | 156/331 |
| 3,857,825 | 12/1974 | Streck et al. | 260/88.1 R |
| 4,428,987 | 1/1984 | Bell et al. | 427/327 |
| 4,448,847 | 5/1984 | Bell et al. | 428/413 |
| 4,812,363 | 3/1989 | Bell et al. | 428/420 |
| 5,053,471 | 10/1991 | Goto et al. | 526/281 |
| 5,063,103 | 11/1991 | Sugawara et al. | 428/285 |
| 5,109,075 | 4/1992 | Yu | 525/404 |

OTHER PUBLICATIONS

Perrott et al, Macro Molecules (1996), 29(5), 1817–23; "Living Ring–Opening Metathesis Polymerizations of 3,4–Disubstituted Cyclobutenes and Synthesis of Polybutadienes with Protic Functionalities," Abstract.

Grubbs, Robert H. And Tumas, William—*Polymer Synthesis and Organotransition Metal Chemistry*, Science, 243 902(1989).

Schrock, Richard R. —*Living Ring–Opening Metathesis Polymerization Catalyzed by Well–Characterized Transition–Metal Alkylidene Complexes*—Acc. Chem. Res., 23 158(1990).

Eng, Frederick P. And Ishida, Hatsuo—*Chemical Depth Profiling Analysis of Polyvinylimidazole Film on Copper*— J. Electrochem. Soc., 35 603(1988).

Hansen, Joan, Kumagai, Masashi And Ishida, Hatsuo— *Silane–modified poly(vinylimidazole) corrosion inhibitors for copper*—35 4780(1994).

Primary Examiner—Shrive Beck
Assistant Examiner—Erma Cameron
Attorney, Agent, or Firm—George H. Libman

[57] ABSTRACT

Coupling agents based on functionalized block copolymers for bonding thermoset polymers to solid materials. These are polymers which possess at least two types of functional groups, one which is able to attach to and react with solid surfaces, and another which can react with a thermoset resin, which are incorporated as pendant groups in monomers distributed in blocks (typically two) along the backbone of the chain. The block copolymers in this invention are synthesized by living ring-opening metathesis polymerization.

17 Claims, 12 Drawing Sheets small molecule
coupling agent block copolymer

BLOCK COPOLYMER ADHESION PROMOTERS VIA RING-OPENING METATHESIS POLYMERIZATION

This invention was made with Government support under Contract No. DE-AC04-76DP00789 awarded by the United States Department of Energy. The Government has certain rights in the invention.

BACKGROUND OF THE INVENTION

1. Field of the Invention

The need to control and optimize the properties of interfaces between solids and thermoset polymeric resins is critical in a host of technologies. Often the adhesive strength of the interface, the resistance to moisture and corrosion (metals), and the ability to transfer stress through the interface are critical to the overall performance of the product. Some examples include layers of conducting metals and polymer dielectrics in the electronics packaging industry, adhesive joints between aluminum or stainless steel and epoxy in the aerospace and automotive industries, and carbon black- or silica-filled rubber in the tire industry.

Etching and controlled pre-oxidation treatments are commonly used to promote adhesion and durability of metal/thermoset interfaces. While excellent performance can often be achieved, these processes are time consuming, costly, and involve harsh chemicals detrimental to the environment. In addition, for certain technologies the roughness of the solid surface, which is an essential element of the etching and pre-oxidation treatments, is detrimental and limiting to the product. One such example is the electronic circuit board industry, where copper line spacings and linewidths can become limited by the roughness of commercial foil treatments. Moreover, in the subtractive process of manufacturing circuit boards, copper must be etched away to pattern the circuit. The difficulty of this processing step increases dramatically with the roughness of the copper.

Several obstacles must be overcome to provide a strong, durable bond between a solid surface and a thermoset resin which does not rely upon physical roughness. First, the thermoset resin and the solid surface must be linked through a chain of chemical bonds. This can be especially difficult for certain metals, such as nickel, which are unreactive toward most functional groups. Second, for metals, the surface of the metal must be protected from oxidation and corrosion which result from the combined effects of heat, oxygen, and water. This criterion is especially severe for certain metals, like copper, which oxidize rapidly when heated in air to produce a weak surface-oxide layer hundreds of nanometers thick. This thick, brittle oxide layer leads to failure at low loadings. Third, the properties of the interface region must be such that the stresses that build up during thermal cycling due to differences in coefficient of thermal expansion can be dissipated nondestructively.

Primer formulations involving small-molecule silane coupling agents work extremely well for glass, silica, and certain metal substrates. However, there are many metals and other inorganic substrates to which silane coupling agents will not bond. Another problem with silanes is that they do not protect metal surfaces from oxidation and corrosion. Small-molecule chelating agents have been proposed as a resolution to this latter problem (U.S. Pat. Nos. 3,837,964; 4,428,987; and 4,448,847). These materials, which possess a chelating group which bonds to the metal and another functional group which bonds to the polymer resin, have demonstrated a significant level of corrosion inhibition under ambient conditions. However, in contrast to silane coupling agents, these do not possess the ability to form a three-dimensional interpenetrating network and entangle with the resin. Moreover, they are susceptible to attack by moisture and are not stable at elevated temperature. Polymers containing chelating agents have demonstrated improved passivation at elevated temperature, but with only a small increase in adhesive strength (Eng and Ishida, Hanson, et al.), likely due to limited reactivity of the chelating agent with the thermoset resin.

Recently, polymeric coupling agents have been proposed (U.S. Pat. No. 4,812,363) which possess a single chemical functionality capable of bonding to both the metal and to the thermoset resin. This reactive group is incorporated at set intervals along the backbone of the polymer. The advantages cited in this method are that the backbone of the polymer can be made hydrophobic to provide increased resistance to water, that attachment of the functional groups to a polymefic backbone adds stability and strength to the interphase, and that polymefic coupling agents can be more efficient than low molecular-weight compounds in dissipating stresses which develop due to mismatch in the coefficient of thermal expansion. However, it has not been demonstrated that the level of passivation is sufficient to protect metals like copper from destructive oxidation after exposure to elevated temperatures such as those achieved in soldering operations. In addition, the method involves the use of multilayers which can lead to failure between the layers. Also, the fact that only one type of functional group is present in the polymer makes it unlikely that both functions, bonding to and passivating metal oxide surfaces and bonding to thermosets, can each be accomplished in an optimal fashion for a variety of metals and thermosets. None of the above performs well enough to replace the etching and oxidation treatments for most applications.

2. Background Art

1. R. H. Grubbs and W. Tumas, Science, 243,902 (1989).
2. R.R. Schrock, Ace. Chem Res., 23, 158 (1990).
3. F. P. Eng and H. Ishida, J. Electrothem. Soc. 35, 603(1988).
4. J. Hanson, M. Kamagai, and H. Ishida, Polymer, 35., 4780(1994).
5. U.S. Patent No. 3,837,964.
6. U.S. Patent No. 4,812,363.
7. U.S. Patent No. 4,428,987.
8. U.S. Patent No. 4,448,847.

SUMMARY OF INVENTION

This invention provides improvement and alleviation of the problems cited above through the use of functionalized block copolymers as coupling agents. In accordance with the present invention, new functionalized block copolymers are synthesized by the method of living ting-opening metathesis polymerization, a process made possible through catalysts developed by Gmbbs et al. and Schrock.. These are polymers which possess at least two types of functional groups which are incorporated as pendant groups in monomers distributed in blocks (typically two) along the backbone of the chain. A diblock copolymer consists basically of two different homopolymers chemically attached together at their ends. The block copolymers synthesized in this invention consist of one block that is able to react with metals or other solid surfaces, and another block that can react with a thermoset polymer.

BRIEF DESCRIPTION OF THE DRAWINGS

The accompanying drawings, which are incorporated in and form part of the specification, illustrate embodiments of this invention and, together with the description, serve to explain the principles of the invention.

Monomers (4b), (4c), and (4d) are newly synthesized monomers.

Monomers (4a), (4b), and (4c) were synthesized with deuterium labels for neutron reflectivity studies.

FIGS. 5a, 5b, 5c, and 5d. Sample BCs synthesized by living ROMP in this work.

BCs (5a) and (5b) are DBCs.

BCs (5c) and (5d) are TBCs.

FIG. 6a and 6b.

Figure 5A:
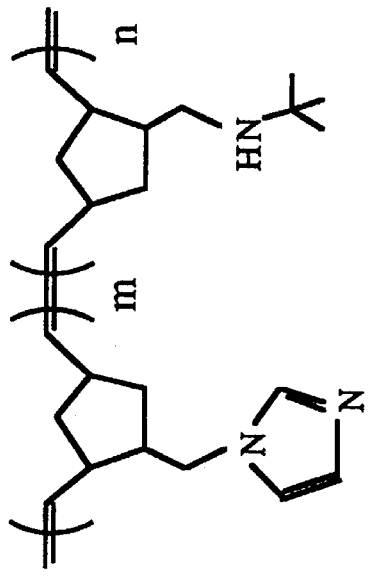
Figure 5B:
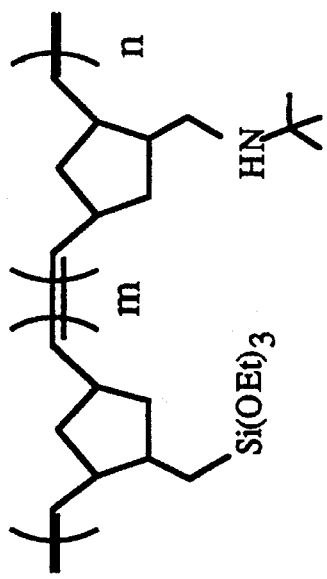
Figure 5C:
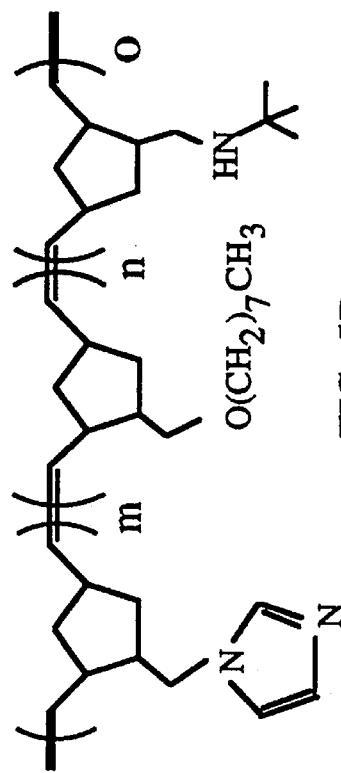
Figure 5D:
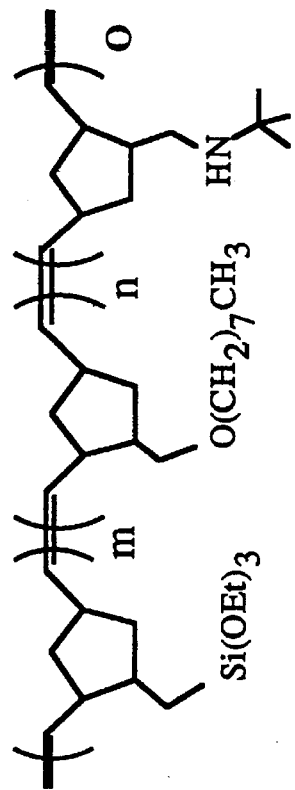

(6a) Neutron reflectivity from the BC CAs of FIG. 5b adsorbed onto copper.

(6b) Conformation of adsorbed BC CAs as determined by neutron reflectivity.

Figure 7A:
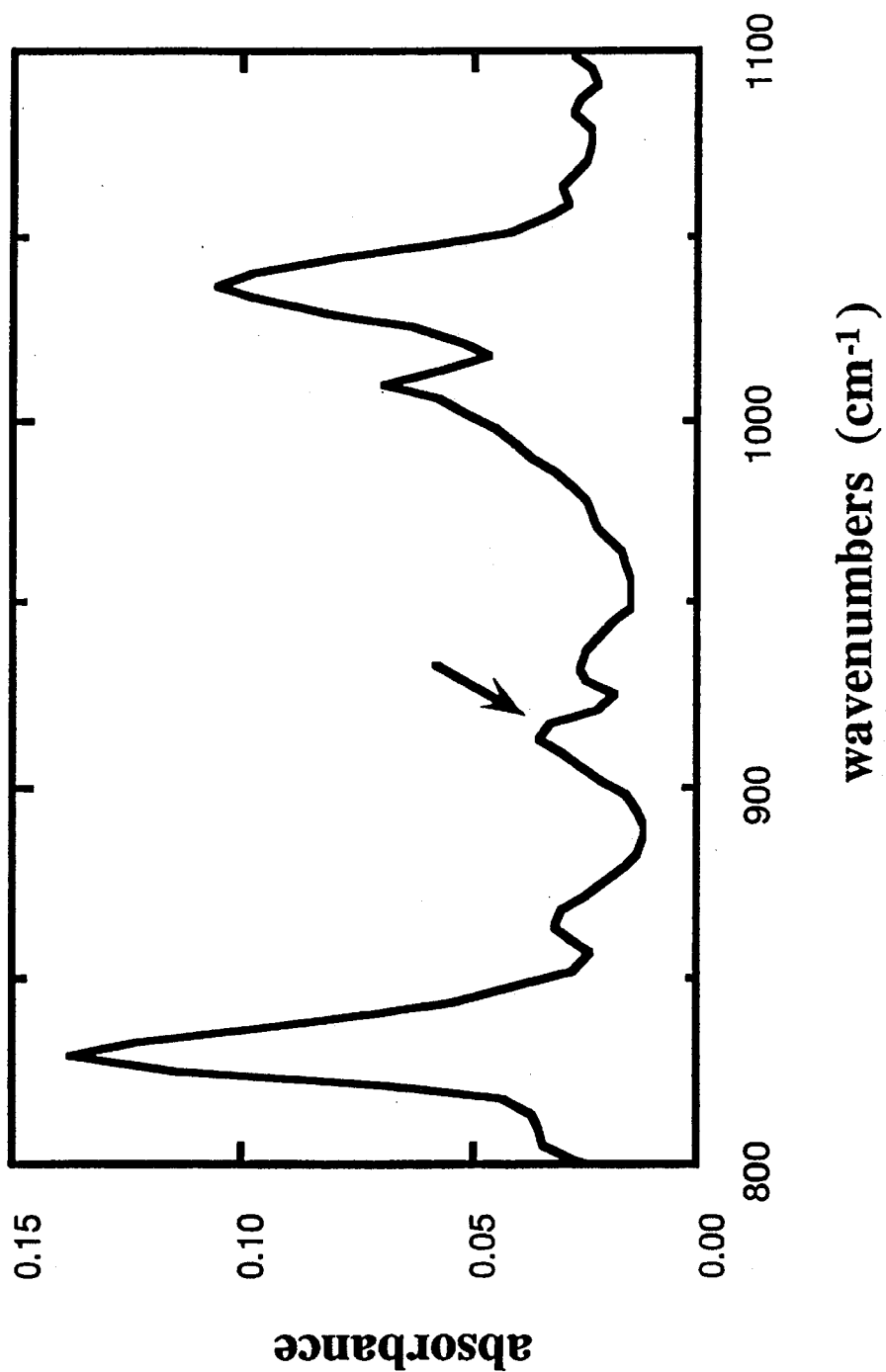
Figure 7B:
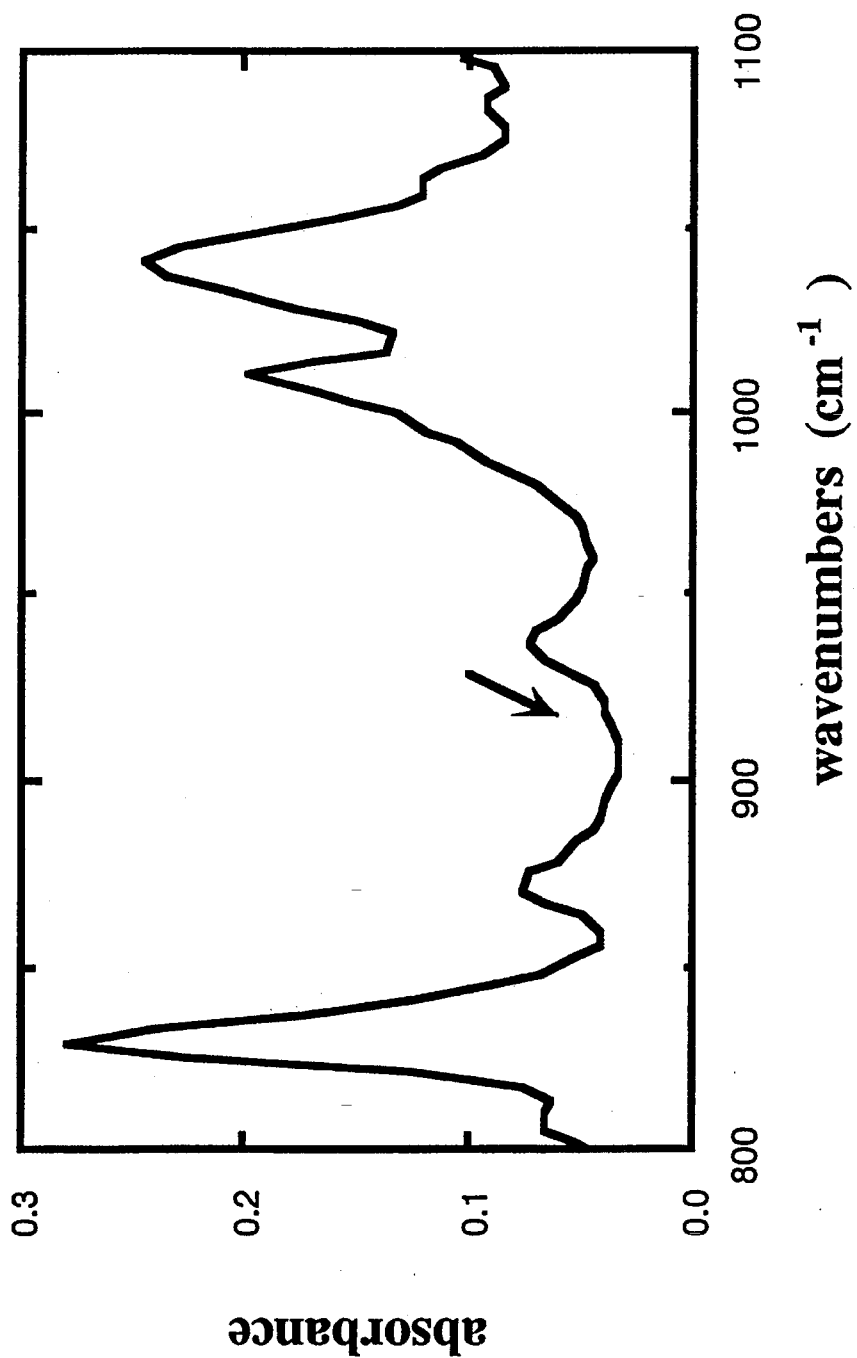
Figure 7C:
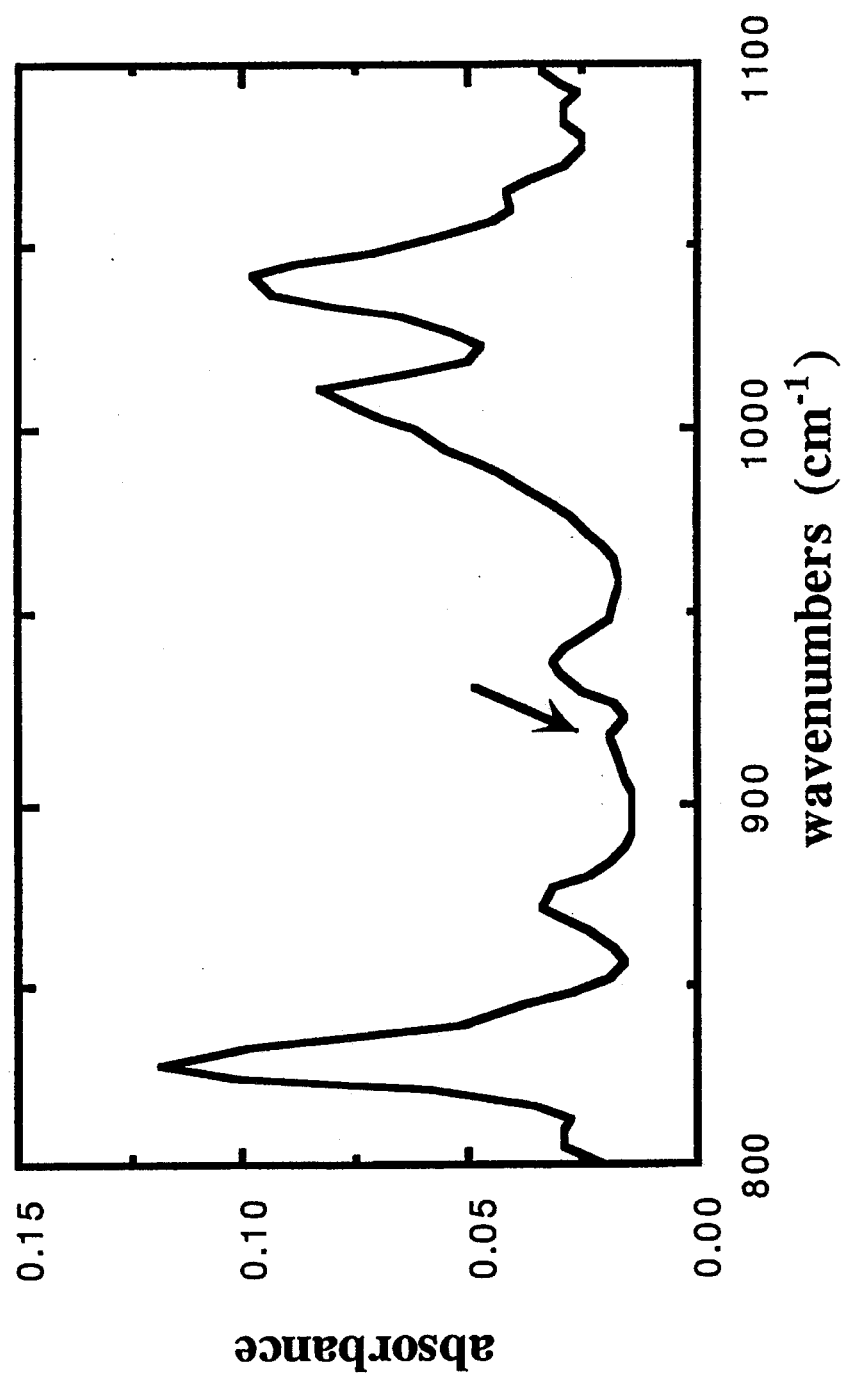

FIGS. 7a, 7b, and 7c. FTIR spectra for FR4 epoxy resin. Arrows indicate the peak at 920 $cm^{-1}$ characteristic of the epoxide-ring vibration which is used to detect the extent of the crosslinking reaction.

(7a) Typical FR4 composition, uncured.

(7b) Typical FR4 composition, cured.

(7c) FR4 composition with DICY replaced by the amine functionalized monomer, cured.

Figure 8A:
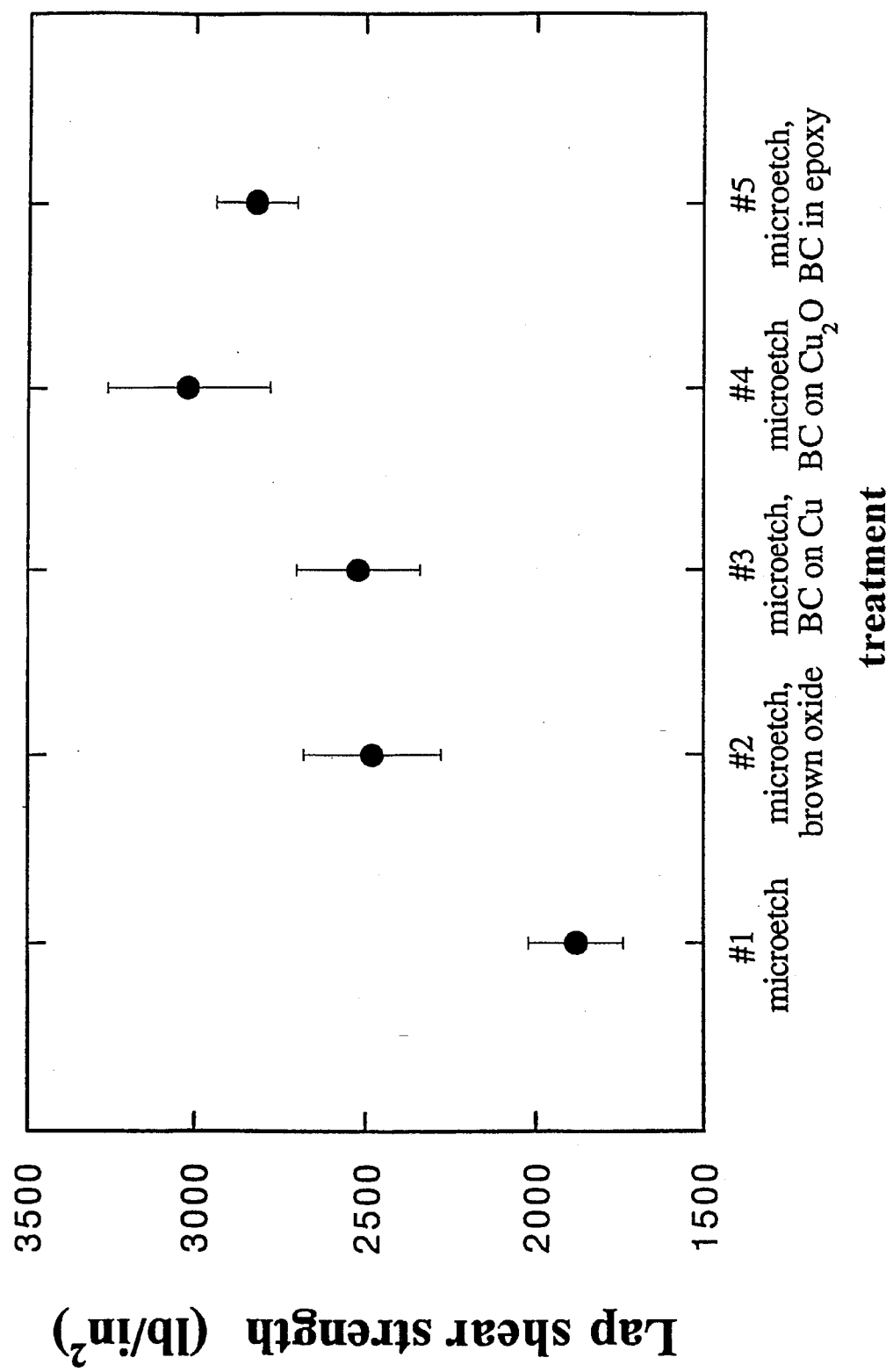
Figure 8B:
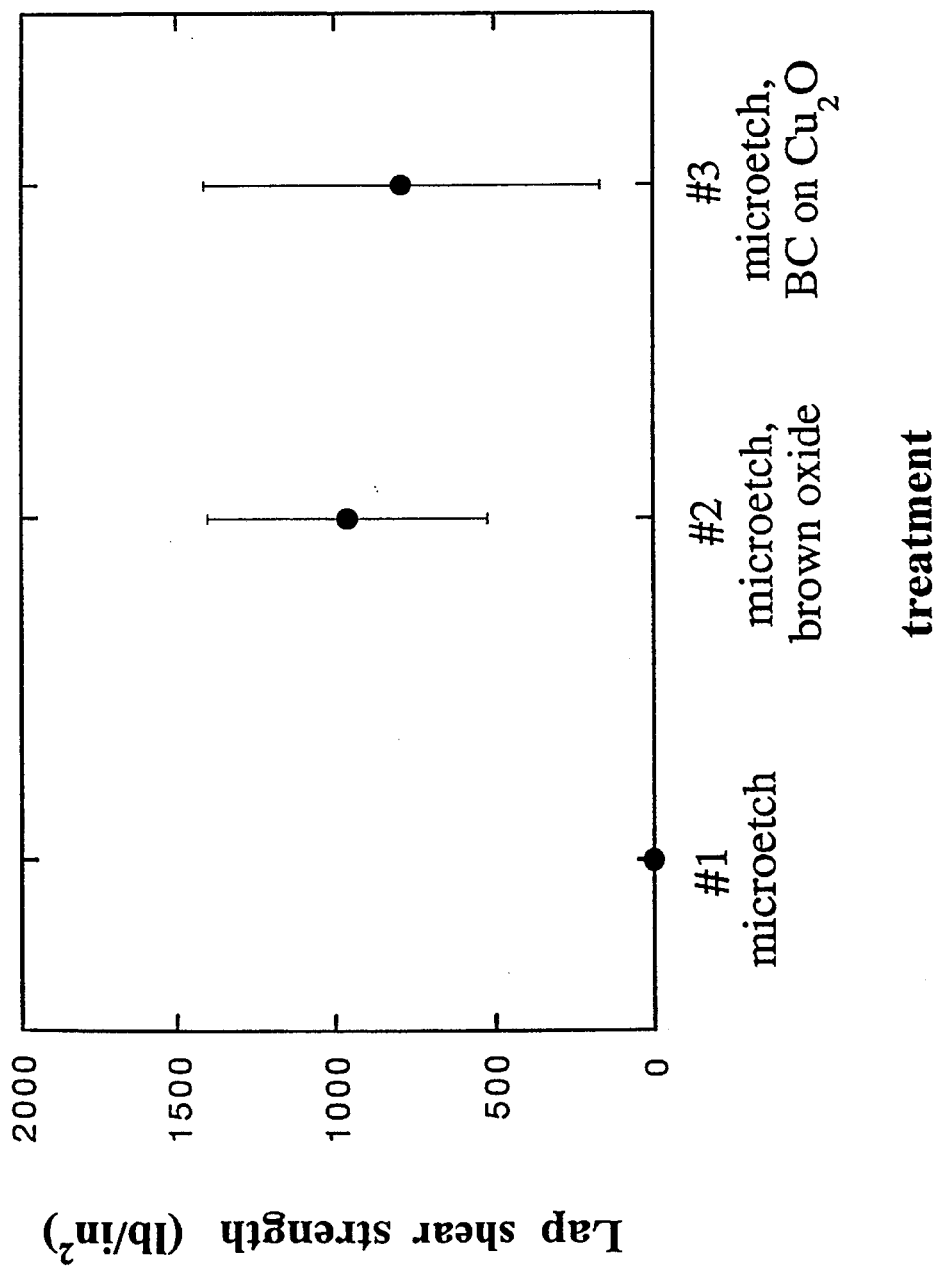

FIG. 8a and 8b. Lap shear adhesion tests.

(8a) Copolymer bonded to bare copper and native copper oxide; no conditioning.

(8b) Samples conditioned by immersion in molten solder for 20 s before testing.

DETAILED DESCRIPTION OF THE INVENTION

Glossary of terms

Figure 1:
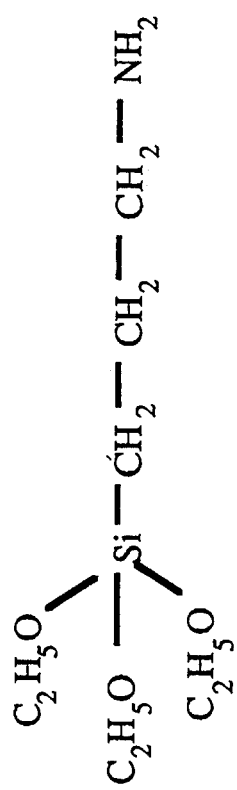
FIG. 1. An example of a SM CA, and an analogous BC that has been synthesized by ROMP.
Figure 1:
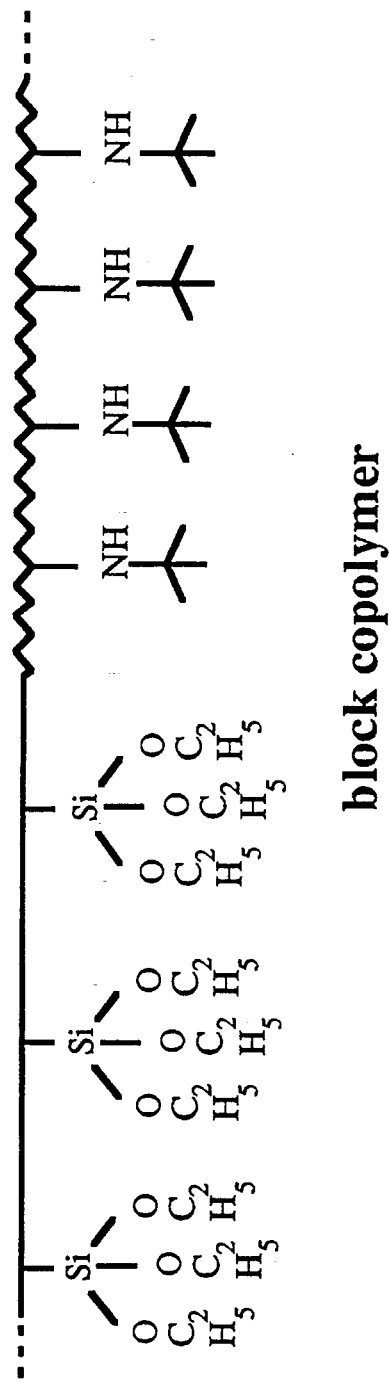

AP=adhesion promoter
CA=coupling agent
BC=block copolymer
DBC=diblock copolymer
DICY=dicyandiamide
FR4=flame-retardant, 4-component epoxy comprised of a brominated epoxy resin, DICY, accelerator, and a solvent
FTIR=Fourier transform infrared
NMR=nuclear magnetic resonance
PWB=primed wiring board
ROMP=ring-opening metathesis polymerization
SM=small molecule
TBC=triblock copolymer
THF=tetrahydrofuran This invention describes bifunctional CAs which are polymeric in nature, as opposed to the more common SM CAs. The difference is illustrated in FIG. 1. Furthermore, in contrast to the polymeric CAs described in U.S. Pat. No. 4,812,363, in which one type of functional group must be chosen to perform both functions, in this invention two types of functional groups are employed to perform the two essential functions. Since two types of functional groups are present, each can be chosen to perform these functions in an optimal fashion. For certain metals like rAckel which form bonds with only a select few functional groups, this flexibility in the design of the copolymer is essential. Since these materials promote adhesion due to chemical bonding, the need for surface roughness is dramatically decreased or eliminated. In addition, the process described in this invention does not involve harsh chemicals detrimental to the environment.

Figure 2:
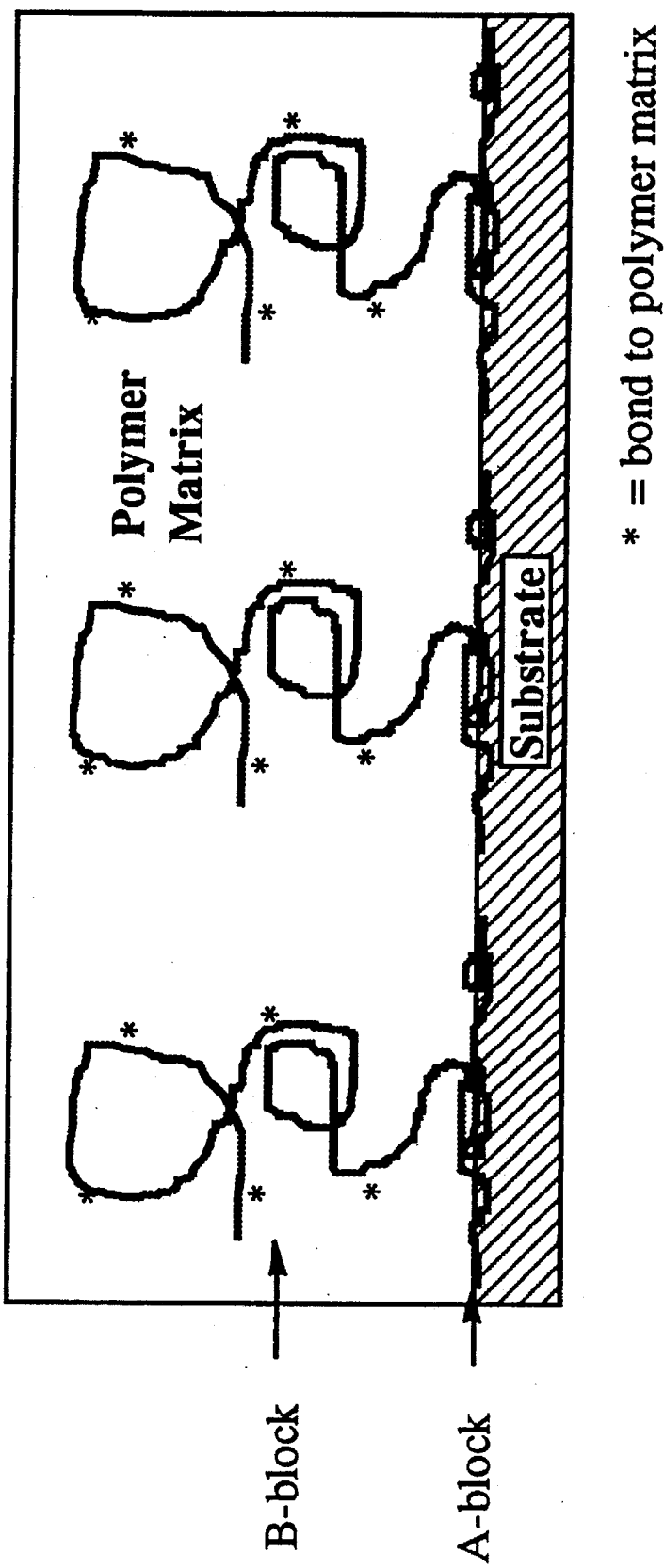
FIG. 2. Conformation of a BC CA at a solid/polymer interface. The first block, A, has reacted with the solid substrate, and the second block, B, has extended into, and reacted with, the thermosetting polymer resin.
Figure 3:
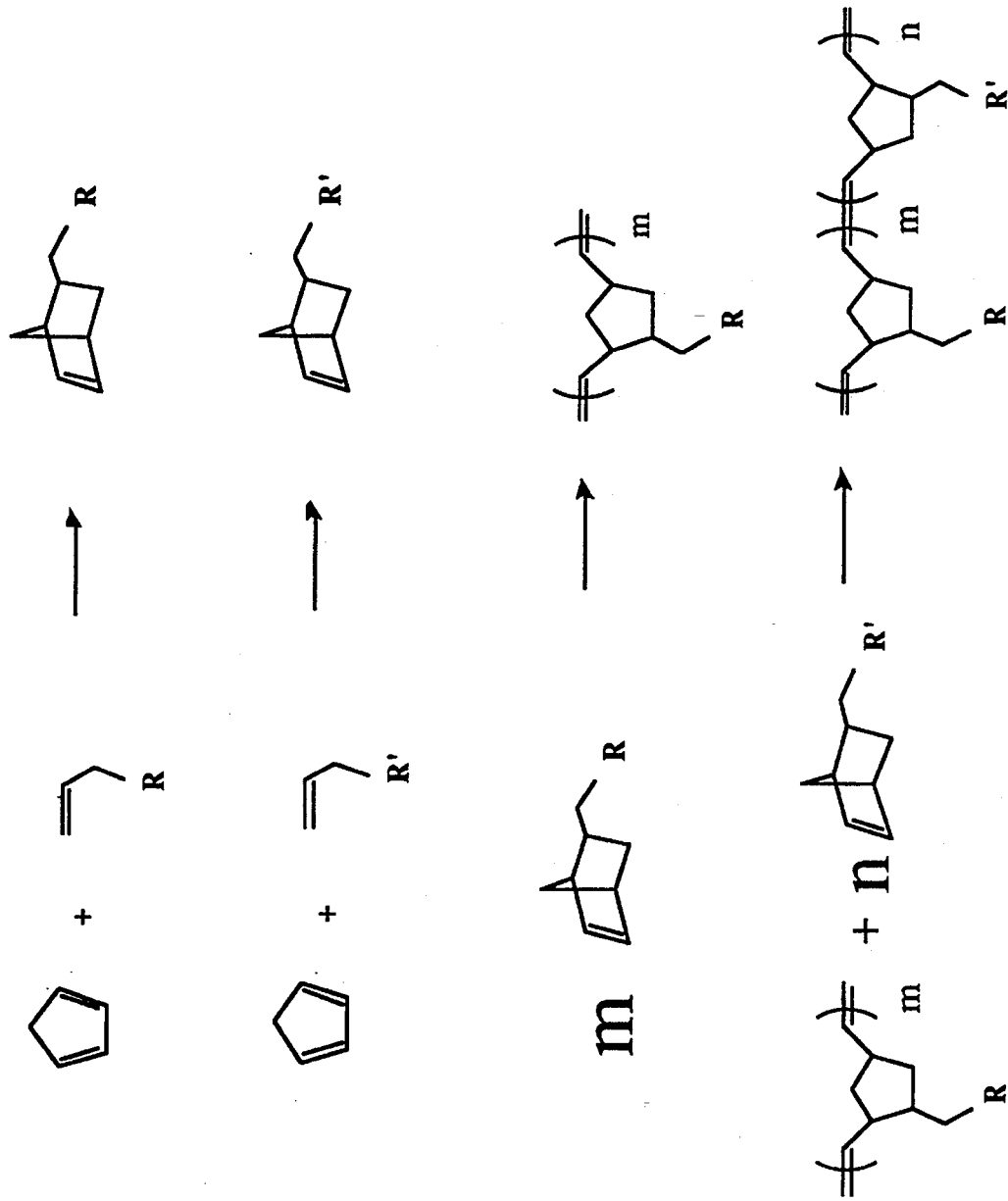
FIG. 3. Synthesis of a DBC by ROMP wherein R is the chemical group attached to each repeat unit of the first block, and R' is the chemical group attached to each unit of the second block.

The fact that the two types of chemical functionalities are present in blocks rather than randomly distributed along the backbone of the polymer has profound significance for the structure of the interphase region, for adhesion, and for passivation of metals. If the two types of functional groups were distributed randomly along the backbone, as in a random copolymer, both groups would be present at the solid surface and also at the interface with the resin. On the other hand, with BCs the two blocks are able to segregate at the interface. This is illustrated in FIG. 2. Thus each block can perform a unique function which is not impeded or diluted by the presence of the other functional group. For example, it is possible that a metal-oxide surface can be exposed only to chelating functional groups, which inhibit oxidation, while the second block can be designed to have a high degree of compatibility with the thermoset resin, and thus penetrate into and entangle with the resin, as well as to chemically react with it. Thus BCs can lead to better passivation of the metal-oxide surface and better compatibility with the resin than their random copolymer counterparts.

A further advantage of the present invention is that only a monolayer of the BC CA is present at the interface. This eliminates the possibility of failure between CA layers. Another advantage of BCs is that there are many attachment points per molecule both to the solid substrate and to the resin. Finally, in the present invention, BCs have also been synthesized to have a middle block, thus forming a TBC. This middle block, which is hydrophobic and flexible, allows additional moisture resistance and stress reduction capabilities to be built into these APs in ways which are not available with existing APs. APs such as described here have not been made previously due to the restrictions related to the conventional synthetic techniques.

ROMP allows great flexibility for creative synthesis of functionalized BCs in that the initiators are relatively insensitive to a wide range of functional groups, in contrast to more traditional techniques which are limited to a rather narrow class of functionalized monomers. The ability to synthesize BCs containing a variety of functional groups provides great flexibility in adapting the concept to various matrices and substrates, and thus is essential to the success of these APs. A schematic of the technique is shown in FIGIll>dE 3 which illustrates the synthesis of a ROMP BC.

The synthesis of BCs by ROMP allows for a wide variety of functionalities to be used, ones that could be specifically designed to chemically bond with a particular surface or polymeric matrix. Other techniques do not tolerate such functionalities and thus cannot be, and have never been, used to make BCs as in this invention. ROMP has never before been used to make BCs specifically for adhesion promotion.

DESCRIPTION OF THE PREFERRED EMBODIMENTS

According to a preferred embodiment of this invention, a method is provided to bond solid surfaces to thermoset polymers using functionalized BCs synthesized by living ROMP. The following example is provided as illustrative of the present invention and is not intended to limit its scope in any way:

EXAMPLE

Bonding copper to glass cloth-reinforced FR4 epoxy is a critical step in the construction of multilayer PWBs. Typically, the treated side of commercial copper foils has large (≈10 μm) mushroom-shaped nodules formed during electroplating. A zinc chromate coating is commonly used to provide a corrosion barrier and to enhance bonding with prepreg in the construction of the core laminates. The large surface roughness leads to mechanical interlocking with the epoxy and excellent adhesion. However, the nodular topography can lead to difficulties when the copper is etched, and also can limit line spacing and line widths. For multilayer PWBs, prepreg must be bonded to the untreated, smooth copper surfaces of the cores. This is usually accomplished with a hot, alkaline sodium chlorite treatment to form a high-surface area dendritic cupric oxide layer. While this treatment is quite successful in promoting adhesion, it is costly, time-consuming, and involves harsh chemicals. In a preferred embodiment of this invention the chemical component of adhesion at the epoxy/copper interface is enhanced through the use of functionalized BCs in order to: i) reduce the profile height required for the nodular surfaces, and ii) enhance or even replace the brown-oxide treatment of the smooth copper surface.

Described below is the synthesis of the BCs by living ROMP, characterization data obtained by neutron reflectivity and FTIR spectroscopy, and results of adhesion tests.
Synthesis The synthesis of BCs by ROMP became possible when Grubbs et al. and Schrock developed molybdenum- and titanium-based initiators capable of living polymerization. These initiators are capable of tolerating a wide variety of chemical functionalities on norbornene-type monomers. Thus the technique lends itself to the synthesis of well-defined, functionalized BCs that can be tailored to a wide variety of interfaces.

Figure 4B:
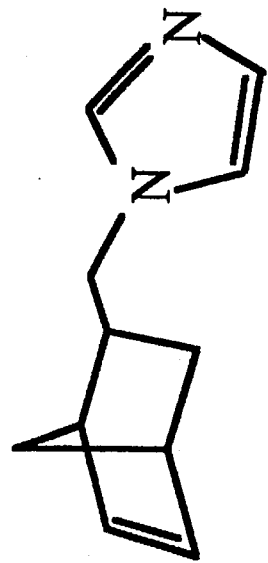
FIGS. 4a, 4b, 4c, and 4d. Monomers used in the BC CAs.
Figure 4D:
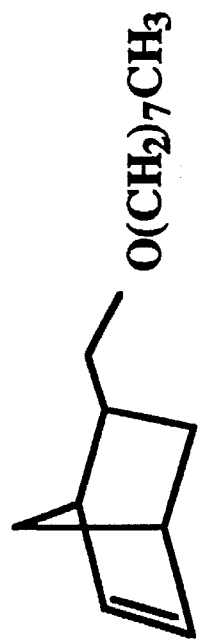
Figure 4A:
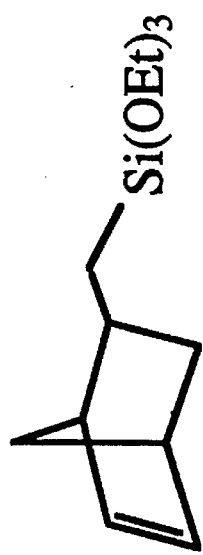

All reactants were from Aldrich Chemical Company. THF was used as the polymerization solvent, and was vacuum distilled from a sodium/benzophenone solution immediately prior to use. The molybdenum-based initiator ((2,6-diisopropylimido) neophylidine-molybdenum-bis-t-butoxide) was from Strem and used without further purification. All polymerizations were performed under an inert atmosphere in a Vacuum Atmospheres dry box.
Monomers Monomer a (FIG. 4a): 5-triethoxysilylnorbornene. This monomer is commercially available from Gelest Inc.

Monomer b (FIG. 4b): 5-(N-imidazolomethyl)norbornene. 65 g of 1-allylimidazole and 16 g of dicyclopentadiene (both from Aldrich) were placed together neat in a 100-ml round-bottom flask. The flask was fitted with a condenser and was then heated with stirring to reflux temperatures (~180 °C.) at ambient pressure under nitrogen. The reaction was allowed to go for 15 h. The reaction solution was then distilled under vacuum (0.5 torr). The first cut, coming over at 25°–100 °C. was discarded (excess 1-allylimidazole). The next cut came over at 105°–115° C. and was shown by NMR to be mostly product. Roughly 30 g of monomer b was collected in this way (71% yield based on dicyclopentadiene).

Figure 4C:
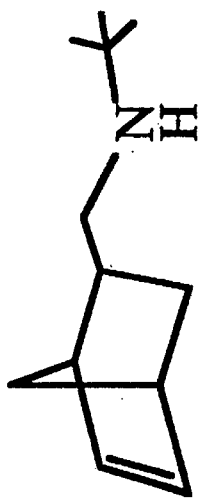

A partially deuterated form of this monomer, used in the neutron reflection experiments, was prepared following the same reaction scheme as that for the protonated imidazole monomer, but starting with a partially deuterated dicyclopentadiene precursor. This sample contained 4 to 5 deuterium atoms per repeat unit Monomer c (FIG. 4c): 5-(t-butylaminomethyl)norbornene. The synthesis of this monomer proceeds in two steps:

Step 1. N-allyl-N-t-butylamine. 525 ml of t-butylamine (Aldrich) were placed in a 1000-ml three-neck flask which was then fitted with a reflux condenser, a mechanical stirrer, and an addition funnel. 145 g of allyl bromide (Aldrich) was placed in the addition funnel. The t-butylamine was then stirred, and the allyl bromide was dripped in slowly over the course of 1 h. A white precipitate (by product of the reaction) formed almost immediately. After the complete addition of the allyl bromide, the reaction was allowed to stir another 3 h. At this time the white precipitate was filtered off and the remaining solution was distilled under ambient pressure. The first cut came over at 65°–100 °C. and was discarded as a mixture of t-butylamine and product. The next cut came over at 103°–105 °C., and was shown by NMR to be the desired product. 106.8 g of product was collected in this way (79% yield).

Step 2. 5-(t-butylanfinomethyl)norbornene. 14 g of dicyclopentadiene and 60 g of the N-allyl-N-t-butylamine were placed neat in a Parr High-Pressure Reactor. The reaction was heated to 185° C. with stirring for 15 h. The reaction was then cooled down and the reaction solution was distilled under vacuum (0.5 torr). The desired product distilled over at 35°–36 °C. 24.6 g of product was collected in this way (64.7% yield).

Monomer d (FIG. 4d): 5-(octaoxymethyl)norbornene. In a three-neck, 500-ml round-bottom flask was placed 4.5 g sodium hydride (while nitrogen flowed through the system). 120 ml tetrahydrofuran (as solvent) was then added to the flask, followed by 40 g of iodooctane. The flask was then fitted with a reflux condenser, addition funnel, and stopper. 21.7 g of 5-norbornene-2-methanol was dissolved in 40 ml of tetrhydrofuran and the solution was placed in the addition funnel. While being stirred under nitrogen, the reaction was heated to 45° C. At this time the 5-norbornene-2-methanol solution was dripped in slowly over the course of 1 h (note—hydrogen evolution occurs during the addition). After complete addition, the solution was heated for another 30 min, then cooled down to room temperature. Most of the solvent was removed under reduced pressure and the remaining solution distilled at 0.5 torr. A distillation temperature and yield were not recorded for this reaction, but NMR showed the product to be the desired monomer.
Copolymers The BCs synthesized for this study are shown in FIGS. 5a–d. Typically one gram of copolymer was formed in about 15 ml of dry TFIF. An appropriate amount of the first monomer was initially stirred with the molybdenum initiator. Upon complete consumption, the second monomer was then added. After the polymerization of the final block, the living-chain ends were terminated by the addition ofbenzaldehyde.

The BC synthesized for the neutron reflectivity study is shown in FI6URE 5b. This copolymer was characterized by proton NMR which showed complete consumption of the amine-functionalized monomer, but only partial consumption of the imidazole monomer. The latter was the last block in the polymerization sequence, and thus did not destroy the continuity of the amine block. The BC were precipitated from acetonitrile, dried, and redissolved in chloroform for future use.

For the imidazole functionalized block, the actual molecular weight (10 kg/mol) was slightly lower than the targeted value (15 kg/mol). The amine functionalized block was assumed to have the targeted molecular weight based upon the observation of total monomer consumption.

Conformation of adsorbed copolymers by neutron reflectivity

Since both the imidazole and amine functionalities have an affinity for the copper surface, it was essential to determine whether the blocks order into layers upon adsorption to a copper substrate, with one block adsorbing preferentially, or whether they adsorb in a disordered conformation with both blocks adsorbing at the surface. This determines whether the BCs can indeed straddle the interface as in FIG. 2. To address this question, copolymer samples were prepared with partially deuterated imidazole blocks, and adsorbed films of these copolymers were examined by neutron reflectivity. With this technique the neutron refractive index profile normal to the surface is obtained with $\approx 5$ A resolution. The selective deuteration allows one to distinguish between the two blocks. The copolymers were adsorbed from solution onto silicon wafers which had been previously sputter coated with smooth, thin ($\approx 250$ A) copper films. Following the adsorption step, the samples were thoroughly washed with MeOH and THF to remove any copolymer not strongly adsorbed to the surface.

Figure 6A:
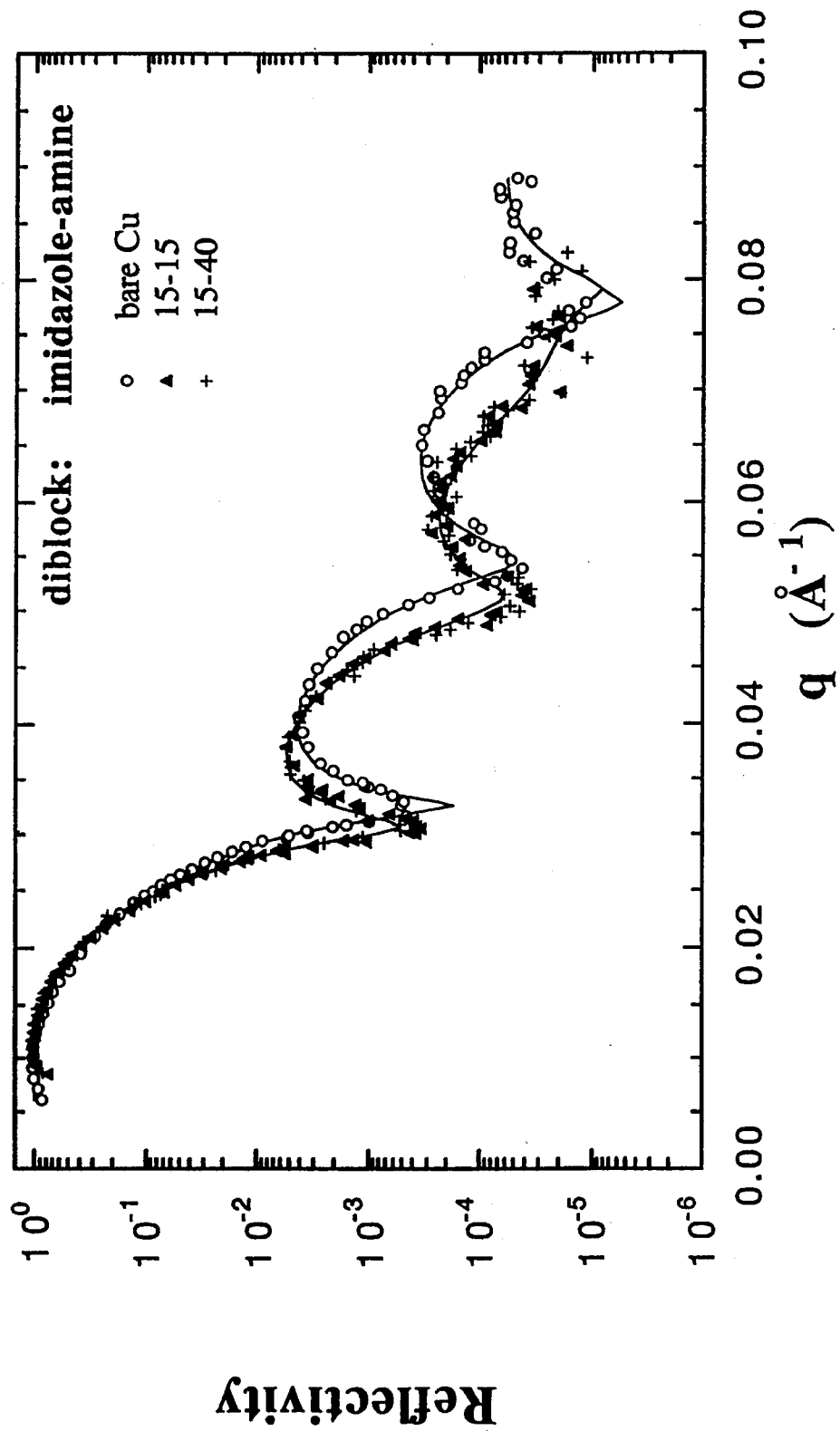
Figure 6B:
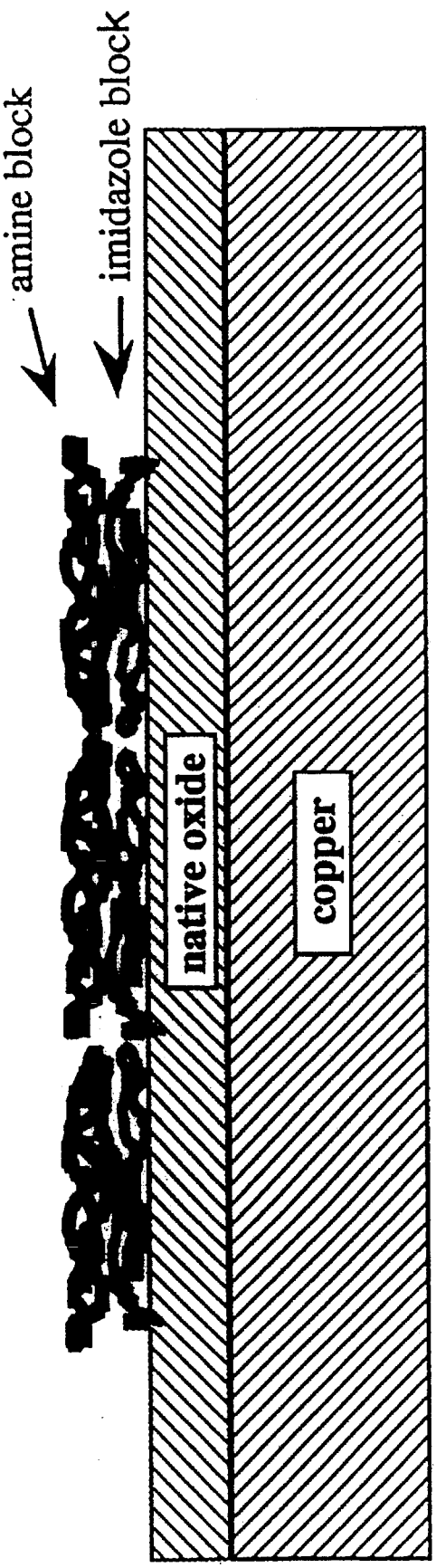

Results for the DBC with targeted block lengths 15K–15K adsorbed from a 0.002-g/ml solution in MeOH are shown in FIG. 6a. The main effect of the adsorbed copolymer on the reflectivity is to shift the fringes to lower q. This is consistent with the imidazole block selectively adsorbing to the surface. The result for the DBC with targeted block lengths 15K–40K adsorbed from the 0.002 g/ml solution in MeOH is also shown in FIG. 6a. The curve follows closely that for the sample with the 15K–15K copolymer. This is expected only if the blocks form separate layers with the imidazole block adsorbed to the surface. The amine blocks are not deuterated and contribute little to the reflectivity in this configuration, and therefore copolymers with differing amine block lengths yield nearly the same reflectivity curve. Thus, these data demonstrate that the copolymer adsorbs in a monolayer film, and that the blocks form separate layers with the imidazole block adsorbed to the surface and the amine block free to penetrate into and bond with the epoxy (FIG. 6b).

Reactivity of the amine fimctionalized toohomer with FR4 epoxy by F71R spectroscopy The reactivity of the amine functionalized monomer toward FR4 epoxy was examined with FTIR spectroscopy. A peak at 920 $cm^{-1}$ is characteristic of the epoxide-ring vibration and is used to detect the extent of the crosslinking reaction. FIG. 7a shows the spectrum for the uncured FR4 epoxy resin. For this sample, all nonvolatile components of the FR4 resin were present (Shell EPON 1124-A-80, dicyandiamide, 2-methyl imidazole), but the sample had not yet been heated. There is a strong peak at 920 $cm^{-1}$ which indicates that very little reaction of the epoxide groups with DICY had occurred. FIG. 7b shows the spectrum for the fully cured FR4 epoxy resin. The sample was identical to that in FIG. 7a except that the sample had been heated to 177° C. for 2 h. The peak at 920 $cm^{-1}$ is now absent, which indicates that nearly all the epoxide groups had reacted. FIG. 7c shows the spectrum for a sample identical to that in FIG. 7b, except that DICY had been replaced by the amine functionalized monomer. As seen in FIG. 7c, the epoxide peak at 920 $cm^{-4}$ has almost completely disappeared, indicating that the amine-functionalized monomer is indeed highly reactive toward the epoxy resin.

Adhesion testing

Lap shear coupons were machined from copper blocks. The bonded surfaces of all samples were milled to a 0.8μm average roughness finish, microetched using Shipley's Preposit Etch 748 solution, and then rinsed thoroughly with aleionized water. The first two sets of samples were controls. Sample set #1 was composed of FR4 epoxy roll-coated directly onto the native oxide of coupons which had been microetched and rinsed. Sample set #2 was composed of coupons which were microetched, rinsed, treated to give the industry-standard brown oxide after the deionized water rinse, and then coated with epoxy. Sample set #3 was immediately placed into a 0.002-g/ml methanol solution of the BC after the microetch and rinse steps in order to test the adhesion to bare copper. Sample set #4 was left in air for 3 h after microetching and rinsing to allow a native oxide to form, and then placed into the methanol solution of the BC. Both sets #3 and #4 were left in the BC solution overnight, then washed thoroughly with methanol, and roll coated with FR4. Sample set #5 was prepared with the BC dissolved in the FR4 resin at 1.8 wt%, replacing the accelerator, 2-methyl imidazole. After curing (10 min at 60° C., 2 h at 177° C.), the samples were cooled to room temperature and pulled in an Instron tester. All sample sets were composed of five coupons each. The data are displayed in FIG. 8a. The rupture strength of samples #3 and #4 was significantly higher than that for the brown-oxide treated samples, and adhesion promotion was greater when the copolymer was bonded to the native oxide rather than to bare copper.

In another test, three sets of five coupons were prepared and then immersed in molten solder before being pulled. The first two sample sets were controls. Sample set #1 was microetched, rinsed, and left in air/br 3 h before being coated with epoxy. Sample set #2 was composed of coupons which were microetched, rinsed, treated to give the industry-standard brown oxide, and then coated with epoxy. Sample set #3 was composed of coupons which were microetched, rinsed, left in air for 3 h to allow the native oxide to form, immersed in a 0.002-g/ml solution of the BC for 2 h, and then coated with epoxy. After curing the epoxy, all three sets of samples were immersed in molten Sn/Pb solder at 260° C. for 20 s prior to being pulled. The results are shown in FIG. 8b. The adhesive strength of samples set #3 after solder dipping is comparable to that of the industry standard brown-oxide treatment, while the samples of set #1 with no treatment all failed upon removal from the solder pot.

What is claimed is:

1. A method for bonding solids to thermoset resins comprising:

selecting a functionalized block copolymer synthesisod by living ring-opening metathesis polymerization and having two types of functional pendant groups in roehomers distributed in blocks;

reacting one functional pendant group of said block copolymer to the solid and other functional pendant group of said block copolymer to the thermoset resin.

2. The method of claim 1 wherein said reacting step comprises the steps of:

a) adsorbing one group of the block copolymer from solution onto the solid;

b) coating the thermoset resin onto the solid containing the adsorbed block copolymer; and c) curing the block copolymer and resin.

3. The method of claim 1, wherein said reacting step comprises the steps of:

a) dissolving the block copolymer into the thermoset resin;

b) coating the thermoset resin containing the block copolymer onto the solid; and c) curing the block copolymer and resin.

4. The method of claim 2 wherein the solid is a metal.

5. The method of claim 2 wherein the solid is an inorganic material other than a metal.

6. The method of claim 2 wherein the solid is a thermoset resin.

7. The method of claim 2 wherein the solid is a carbonaceous material.

8. The method of claim 3 wherein the solid is a metal.

9. The method of claim 3 wherein the solid is an inorganic material other than a metal.

10. The method of claim 3 wherein the solid is a thermoset resin.

11. The method of claim 3 wherein the solid is a carbonaceous material.

12. The method of claim 2 wherein functional groups within the functionalized block copolymer are selected from the group consisting of 1,2,3-triazole, benzotriazole, naphthotriazole, imidazole, benzimidazole, 2-mercaptobenzimidazole, naphthimidazole, indazole, 2-mecaptothiazole, 2-mercaptobenzthiazole, 2-mercaptobenzoxazole, thiolesters, thiols, triethoxysilyl, trimethoxysilyl, trichlorosilyl, primary and secondary amines, carboxylic acids, vinyls, and disulfides.

13. The method of claim 3 wherein functional groups within the functionalized block copolymer are selected from the group consisting of 1,2,3-triazole, benzotriazole, naphthotriazole, imidazole, benzimidazole, 2-mercaptobenzimidazole, naphthimidazole, indazole, 2-mecaptothiazole, 2-mercaptobenzthiazole, 2-mercaptobenzoxazole, thiolesters, thiols, triethoxysilyl, trimethoxysilyl, trichlorosilyl, primary and secondary amines, carboxylic acids, vinyls, and disulfides.

14. The method of claim 2 wherein the block copolymer is selected from the group consisting of diblock, triblock, and other multiblock copolymers.

15. The method of claim 3 wherein the block copolymer is selected from the group consisting of diblock, triblock, and other multiblock copolymers.

16. The method of claim 12 wherein the block copolymer is synthesized by the steps of:

a) selecting one functional pendant group that will bind to the resin and another functional pendant group that will bind to the solid;

b) synthesizing two monomers, each monomer containing a different one of said functional groups and being capable of polymerization by living ring-opening metathesis polymerization; and c) synthesizing the block copolymer from said monomers by living ring-opening metathesis polymerization.

17. The method of claim 13 wherein the block copolymer is synthesized by the steps of:

a) selecting a functional pendant group that will bind to the resin and a functional pendant group that will bind to the solid;

b) synthesizing two monomers, each monomer containing a different one of sid functional groups and being capable of polymerization by living ring-opening metathesis polymerization; and c) synthesizing the block copolymer from said monomers by living ring-opening metathesis polymerization.

* * * * *